United States Patent [19]

McDonald

[11] Patent Number: 5,196,742
[45] Date of Patent: Mar. 23, 1993

[54] LOW VOLTAGE DIFFERENTIAL CIRCUIT

[75] Inventor: Mark D. McDonald, Fremont, Calif.

[73] Assignee: National Semiconductor Corporation, Santa Clara, Calif.

[21] Appl. No.: 905,106

[22] Filed: Jun. 26, 1992

[51] Int. Cl.[5] .................... H03K 5/22; H03K 5/153
[52] U.S. Cl. .................... 307/355; 307/271; 307/529; 307/356; 307/296.3; 328/15; 328/156
[58] Field of Search ............ 307/271, 529, 296.3, 307/355-356, 350; 328/15, 156

[56] References Cited

U.S. PATENT DOCUMENTS 5,138,201 8/1992 Ohbayashi et al. ............. 307/355

FOREIGN PATENT DOCUMENTS 0004615 1/1991 Japan .......................... 307/529

OTHER PUBLICATIONS

Article entitled "A 1.8 GHz Low Power & Low Voltage Silicon Dual Modulus Prescaler" relating to the VLSI Circuit Symposium of 1987 Aichi Japan pp. 95-96.
Circuits showing transistor comparator-Classified in 307-354 admitted prior art as of Jun. 26, 1992.
Dennis L. Feucht, *Handbook of Analog Circuit Design*, pp. 27-32 (1990), Academic Press, San Diego.

*Primary Examiner*—William L. Sikes
*Assistant Examiner*—Margaret Rose Wambach
*Attorney, Agent, or Firm*—Limbach & Limbach

[57] ABSTRACT

A circuit of use as a multiplier or a logic cell and suitable for low voltage operation. At least three differential transistor stages are used, with two of the stages receiving one input signal, such as a data input signal if the circuit is to function as a logic cell and a multiplicand if the circuit is to function as a multiplier. A load is provided for the two stages which is connected to one of the circuit supply voltages. The third differential transistor stage receives a second input signal which is the other multiplicand if the circuit is configured as a multiplier and which is a clock signal if the circuit is configured as a logic cell. Circuitry is provided for controlling current flow through the first and second stages in response to current flow in the third stage. If the circuit is configured as a multiplier, the change in current flow in the first and second stages caused the transconductance of the stages to change so that multiplying action will take place. If the circuit is configured as a logic cell, the change is current flow due to the transitions in the clock causes the first stage to be active so that the data input is first transferred to that stage. Further transitions in the clock then cause the first stage to be inactive and the second stage active so that the data is transferred from the first to the second stage and stored in the second stage. The circuit architecture permits low voltage operation such as needed in battery powered applications.

31 Claims, 7 Drawing Sheets

FIG. 13

LOW VOLTAGE DIFFERENTIAL CIRCUIT

BACKGROUND OF THE INVENTION

1. Field of the Invention

The present invention relates generally to circuits and in particular to circuits having differential stages and which operate at relatively low voltages.

2. Background Art

There are a wide variety of electronic circuits which include one or more differential amplifier stages and which are capable of operating at power supply voltages of 5 or more volts. However, there is an increasing demand for circuits which perform the same functions, but which operate at even lower voltages.

The increased demand in low voltage circuits is created in part by the use of batteries as power sources. A typical battery supply voltage is 3 volts, which is provided by connecting two dry cells in series. Unfortunately, many conventional circuits will not operate properly at this low voltage.

Figure 1:
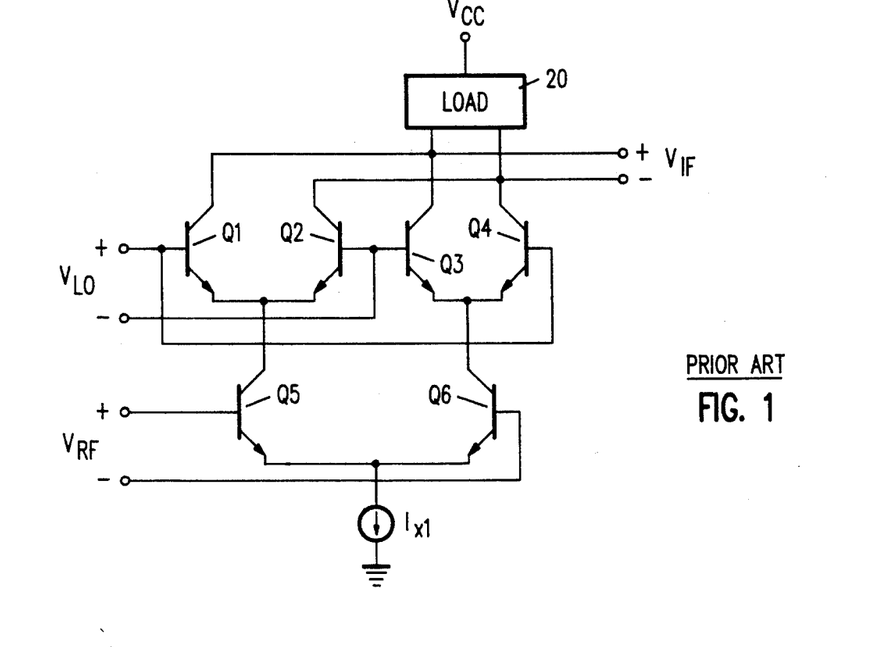
FIG. 1 is a schematic diagram of a conventional Gilbert cell which can be used as a multiplier, mixer and other applications.

Referring to the drawings, FIG. 1 depicts a conventional circuit, commonly referred to as the Gilbert cell, which is widely used to provide functions such as multiplication, frequency conversion, modulation and demodulation. These functions are related and, for purposes of convenience, are referred to collectively herein as multipliers. In the present example, the circuit is used a frequency converter for a radio receiver which converts an RF input signal $V_{RF}$ to an intermediate frequency signal $V_{IF}$ by mixing the RF signal $V_{RF}$ with a local oscillator signal $V_{LO}$.

The converter includes a first differential pair of NPN transistors $Q_1$ and $Q_2$ and a second differential pair of NPN transistors $Q_1$ and $Q_2$ which drive a common load 20. The base electrodes of transistors $Q_1$ and $Q_4$ form the positive input for the differential oscillator input signal $V_{LO}$ and the base electrodes of transistors $Q_2$ and $Q_3$ form the negative input for the signal.

An NPN transistor $Q_5$ has a collector connected to the common emitter connection of transistors $Q_1$ and $Q_2$ and a further NPN transistor $Q_6$ has a collector connected to the common emitter connection of transistors $Q_3$ and $Q_4$. The common emitter connection of transistors $Q_5$ and $Q_6$ is connected to a current source $I_{X1}$. The base electrodes of transistors $Q_5$ and $Q_6$ form the positive and negative inputs, respectively, for the differential RF input signal $V_{RF}$.

The transconductance and, therefore, the gain of the differential pair $Q_1$ and $Q_2$ and differential pair $Q_3$ and $Q_4$ is controlled by varying the amount of current flow through the two pair. Thus, since transistors $Q_5$ and $Q_6$ control the current flow though the two differential pair, the gain varies with input $V_{RF}$. Thus, the differential output $V_{IF}$ at the collectors of transistors $Q_1$, $Q_2$, $Q_3$, and $Q_4$ is a function of both $V_{LO}$ and $V_{RF}$.

The voltage across the FIG. 1 circuit is the supply voltage Vcc. The minimum voltage can be determined by inspection and is set forth in the following equation.

$$V_{MIN} = V_{CE(Q1/2/3/4)} + V_{CE(Q5/6)} + V_{ZL} + V_{IX} \quad (1)$$

where $V_{MIN}$ is the minimum supply voltage;
$V_{CE}$ is the minimum quiescent collector-emitter voltage;
$V_{ZL}$ is the minimum quiescent load voltage; and
$V_{IX}$ is the minimum quiescent current source voltage.

Assuming that for reliable operation voltages $V_{CE}$ and $V_{IX}$ must be 0.75 volts and $V_{ZL}$ must be 1 volt, the minimum supply voltage is 3.25 volts. Thus, the FIG. 1 circuit cannot reliably operate on the 3 volts provided by two dry cells connected in series.

Figure 2:
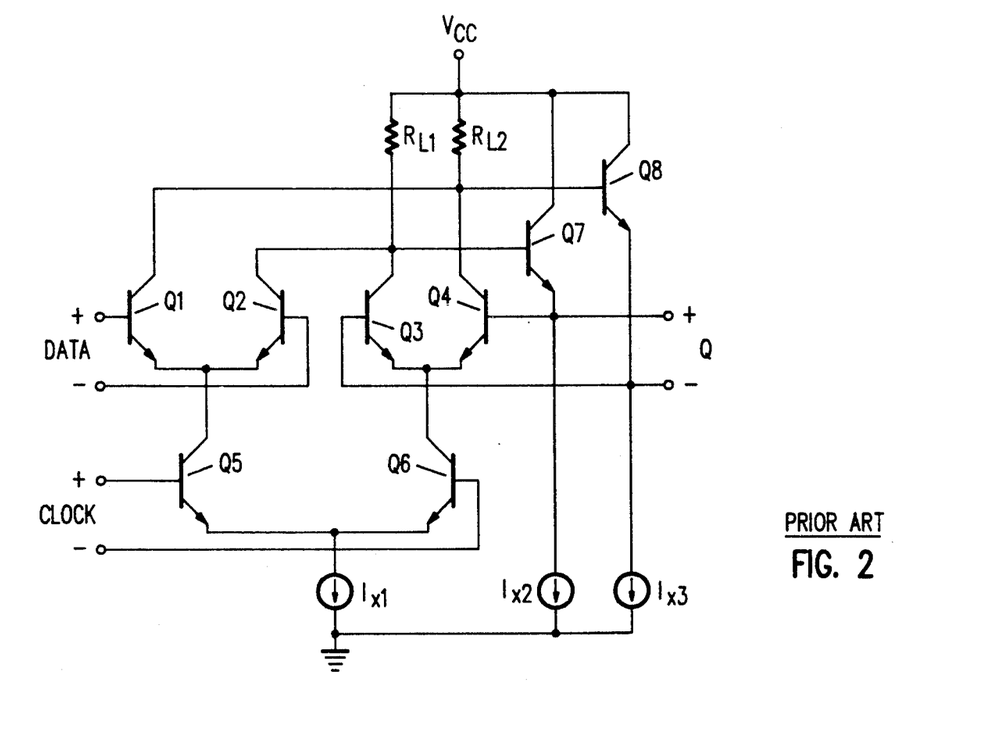
FIG. 2 is a schematic diagram of a conventional logic cell which can be used, for example, as a flip-flop for storing data.

A further exemplary conventional circuit is the current mode logic circuit shown in FIG. 2, sometimes referred to as emitter coupled logic. The exemplary logic circuit is a latch which stores data present at the data input upon receipt of a clock input.

NPN transistors $Q_1$ and $Q_2$ form an input different pair and transistors $Q_3$ and $Q_4$ form an output differential pair. The input differential pair $Q_1$ and $Q_2$ is driven by the data input. The output differential pair are driven by the input differential pair through emitter-follower configured transistors $Q_7$ and $Q_8$. Both differential pairs utilize common load resistors $R_{L1}$ and $R_{L2}$.

The input and output differential pair are gated by a common gating circuit which includes a third differential pair made up of NPN transistors $Q_5$ and $Q_6$. The collector of transistor $Q_5$ is connected to the emitters of transistors $Q_1$ and $Q_2$ and the collector of transistor $Q_6$ is connected to the emitters of transistors $Q_3$ and $Q_4$. Finally, the common emitters of transistors $Q_5$ and $Q_6$ are coupled to a current source $I_{X1}$. The output of the cell is at the emitters of transistors $Q_7$ and $Q_8$, with the emitters also being connected to current sources $I_{X2}$ and $I_{X3}$, respectively.

The operation of the conventional logic cell is well known. When the clock is in a first phase, transistor $Q_5$ is on and transistor $Q_6$ is off. Thus, the data input will switch transistors $Q_1$ and $Q_2$ to opposite states, depending upon the data. When the clock is in a second phase, transistor $Q_5$ is off and $Q_6$ is on. The data stored at the input pair will then be transferred to the output pair and to the output. Note that feedback is provided by transistors $Q_7$ and $Q_8$ which increases the switching speed. Since the input pair is disabled ($Q_5$ is off), any further changes in the data input will not affect the circuit.

Again, the voltage across the FIG. 2 circuit is the supply voltage Vcc. By inspection, it can be seen that the minimum voltage is in accordance with the following equation:

$$V_{MIN} = V_{CE(Q6/5)} + V_{BE(Q7/8)} + V_{BE(Q1/2/3/4)} + V_{ZL} + V_{IX} \quad (2)$$

where, $V_{MIN}$ is the minimum supply voltage;
$V_{CE}$ is the minimum quiescent collector-emitter voltage;
$V_{BE}$ is the minimum quiescent base-emitter voltage;
$V_{ZL}$ is the minimum quiescent load voltage; and
$V_{IX}$ is the minimum quiescent current source voltage.

Assuming that the minimum voltage for $V_{CE}$ is 0.75 volts, $V_{BE}$ is 0.75 volts, $V_{ZL}$ is 0.25 and $V_{IX}$ is 0.75 volts, it can be seen that the minimum supply voltage will be approximately 3.25 volts. Thus, the FIG. 2 cell cannot reliably operate using two dry cells.

Figure 7:
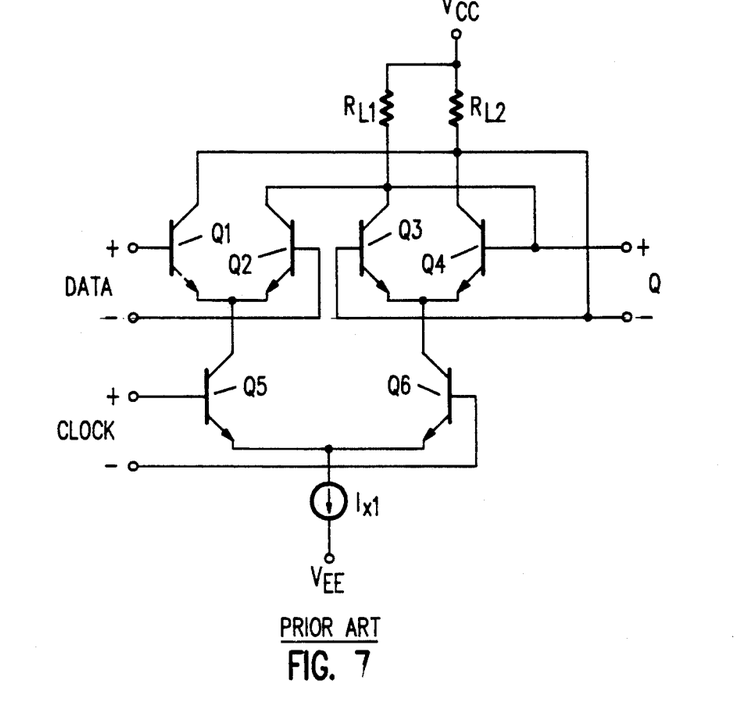
FIG. 7 is a schematic diagram of a conventional logic cell capable of operating at reduced voltages.

FIG. 7 depicts a conventional logic cell with the output transistors $Q_7$ and $Q_8$ (FIG. 2) and associated circuitry removed. As will be explained later in greater detail, the FIG. 7 circuit is capable of operating a lower supply voltage than the FIG. 2 circuit but even lower operating voltages would be desirable.

There is a need for circuits which can perform the functions of the conventional Gilbert cell of FIG. 1 and the logic cell of FIG. 2 and still operate reliably at the relatively small voltages provided by batteries. These and other shortcomings of the prior art are overcome by the present invention as described in the following Detailed Description of the Invention together with the drawings.

SUMMARY OF THE INVENTION

A circuit for processing a pair of input signals and which is suitable for low voltage operation is disclosed. One embodiment of the circuit is a logic cell having a data input and a clock. Another embodiment of the circuit is a Gilbert cell which performs multiplier and related functions.

The circuit includes first and second power supply busses, one of which may function as the circuit common. A first control stage is included for receiving a first one of the input signals. The control stage includes first and second differential stages, with the first stage including first and second transistors and the second stage including third and fourth transistors. The transistors each include first, second and third electrodes. If bipolar transistors are used, the first, second and third electrodes are the emitter, base and collector, respectively. If FET devices are used, the first, second and third transistors are the source, gate and drain, respectively.

If, by way of example, the circuit functions as a logic cell, the first signal is the data input signal. As a further example, if the circuit functions as a multiplier, the first signal is one of the two signals to be multiplied.

A load means, such as a resistive load, is provided which functions as the load for at least the second differential stage. The load means is coupled between the second differential stage and the first power bus. The output signal of the circuit appears at the junction of the load means and the second differential stage.

The circuit further includes a second control stage means for controlling the current flow through the first and second differential stages in response to the second input signal. If the circuit is a logic cell, for example, the second input signal is the clock signal. If, as a further example, the circuit is a multiplier, the second signal is the second signal to be multiplied.

The second control stage means includes a third differential stage having fifth and sixth transistors, each having first, second and third electrodes. The first electrodes, which are the emitter electrodes if bipolar transistors are used, are coupled together. A first current source is coupled between the first electrodes and the first bus.

The second control stage also includes current control means for controlling the current flow in the first and second differential stages in response to the current flow in the third differential stage. The current control means is coupled between the first electrodes of the first, second, third and fourth transistors and the second bus. In one embodiment, the current control means includes a pair of current mirrors. In another embodiment, the current control means includes a pair of current sources, each connected to one of the first and second differential pair and each connected to the third electrode of the fifth and sixth transistors.

A principal advantage of the claimed circuit is that it can be configured to provide different function such as a logic cell or a multiplier and yet can operate at relatively low voltages applied between the first and second busses.

DETAILED DESCRIPTION OF THE INVENTION

Figure 3:
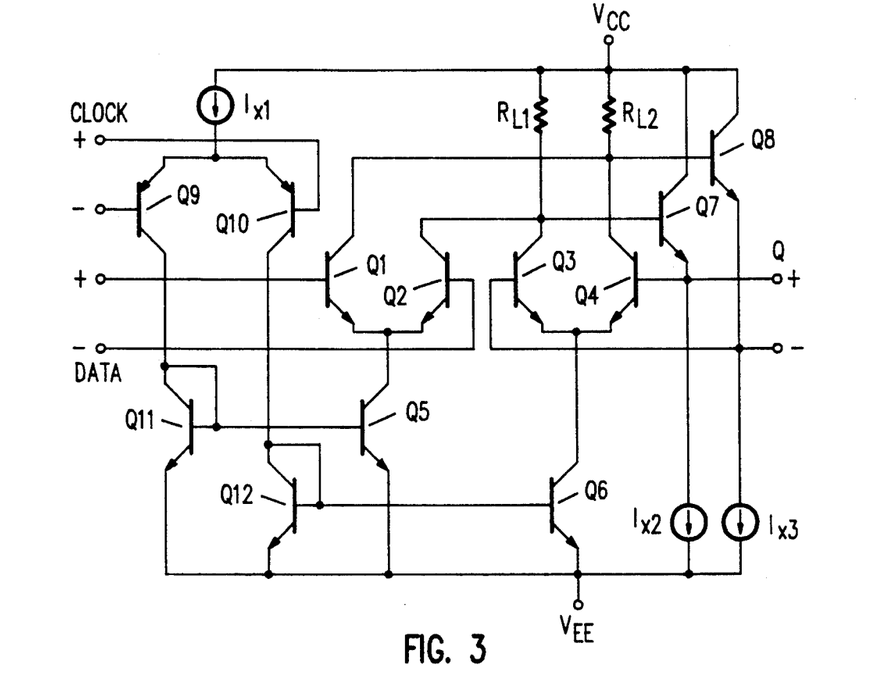
FIG. 3 is a schematic diagram of one embodiment of the present invention in the form of a logic cell.

Referring again to the drawings, FIG. 3 shows a modified logic cell which primarily utilizes NPN transistors and which is capable of reliable low voltage operation. It should be noted that the present invention can be implemented using transistor types other than bipolar transistors, including FETs and HBTs. The modified cell includes an input differential pair including NPN transistors $Q_1$ and $Q_2$ and an output differential pair which includes NPN transistors $Q_3$ and $Q_4$. The two differential pairs share common load resistors $R_{L1}$ and $R_{L2}$.

The output of the output differential pair ($Q_3/Q_4$) is coupled to the output of the cell by way of a pair of emitter-follower configured transistors $Q_7$ and $Q_8$. Transistors $Q_7$ and $Q_8$ are connected to current sources $I_{X1}$ and $I_{X2}$, respectively. These transistors also provide feedback for increasing switching speed.

Current is provided to the input differential pair by NPN transistor $Q_5$ and to the output differential pair by NPN transistor $Q_6$. Transistors $Q_5$ and $Q_6$ are controlled by a switching circuit which is responsive to the clock signal. The switching circuit includes a differential pair of PNP transistors $Q_9$ and $Q_{10}$ connected to a common current source $I_{Y1}$. The clock signal is fed to the bases of transistors $Q_9$ and $Q_{10}$.

The switching circuit further includes a pair of NPN transistors $Q_{11}$ and $Q_{12}$ which function as active loads for transistors $Q_9$ and $Q_{10}$, respectively. Transistors $Q_{11}$ and $Q_{12}$ are diode connected with the base and collector electrodes shorted together. The base/collector electrodes of transistors $Q_{11}$ and $Q_{12}$ are coupled to the base electrode of transistors $Q_5$ and $Q_6$, respectively. Transistor pair $Q_{11}$ and $Q_5$ and pair $Q_{12}$ and $Q_6$ each function as current mirrors so that the current in the diode half of the pair is reflected in the transistor half.

Operation of the FIG. 3 cell will now be described. When the clock is in a first phase, transistor $Q_9$ is conducting and transistor $Q_{10}$ is off. Through the operation of the current mirror, transistor $Q_5$ will be turned on and transistor $Q_6$ will be off. Thus, the input differential pair comprising transistors $Q_1$ and $Q_2$ will be active and will respond to the data input.

In the second phase of the clock, transistor $Q_9$ will be switched off and transistor $Q_{10}$ will be switched on. This will cause the input differential pair comprising transistors $Q_1$ and $Q_2$ to become inactive and the output differential pair comprising transistors $Q_3$ and $Q_4$ to become active. The data stored in the input pair will be transferred to the output pair comprising transistors $Q_3$ and $Q_4$ and to the output of the cell by way of the emitter-follower transistors $Q_7$ and $Q_8$. Since the input pair are inactive, the cell will not respond to any further changes in the data input.

The minimum operating voltage for the modified cell of FIG. 3 is less than the voltage required by the conventional cell of FIG. 2. The minimum voltage for the input circuit to operate is limited by the voltage required for the output differential pair to operate. That voltage is determined by inspection and is as follows:

$$V_{MIN} = V_{ZL} + V_{BE(Q7/8)} + V_{BE(Q3/4)} + V_{CE(Q6)} \quad (3)$$

where $V_{MIN}$ is the minimum operating voltage for the modified cell;

$V_{ZL}$ is the minimum quiescent voltage across the load resistors $R_{L1}/R_{L2}$;

$V_{BE(Q7/8)}$ is the minimum quiescent base-emitter voltage of transistors $Q_7/Q_8$;

$V_{BE(Q3/4)}$ is the minimum quiescent base-emitter voltage for transistors $Q_{3/4}$; and $V_{CE(Q6)}$ is the minimum quiescent collector/emitter voltage for transistor $Q_6$.

Assuming that the minimum voltage for the three base-emitter voltages is 0.75 volts and the minimum voltage for the load resistors is 0.25 volts, it can be seen that the minimum voltage for reliable operation of the modified cell of FIG. 3 is 2.75 volts, a significant improvement over the conventional cell of FIG. 2 which requires 3.25 volts.

As is the case with all of the circuits disclosed herein, the loads may be implemented either as resistive loads ($R_{L1}/R_{L2}$) or as active loads. The active loads may include, for example, a pair of transistors configured as a current mirror.

Figure 4:
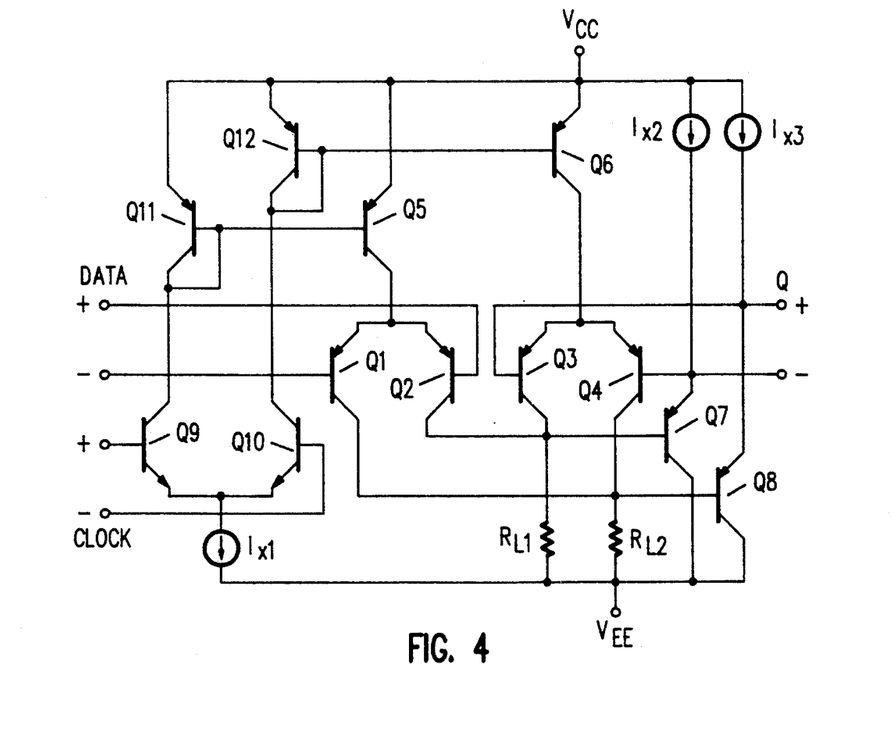
FIG. 4 is a schematic diagram of a further embodiment of the present invention which is the complement of the circuit of FIG. 3.

FIG. 4 depicts the complement of the modified cell of FIG. 3 where PNP transistors have been replaced with NPN transistors and NPN transistors have been replaced with PNP transistors. Further, the polarity of the supply voltage is reversed. Operation of the FIG. 4 circuit is the same as that of FIG. 3 and the minimum operating voltage is also improved to the same extent as that of FIG. 3.

Figure 5:
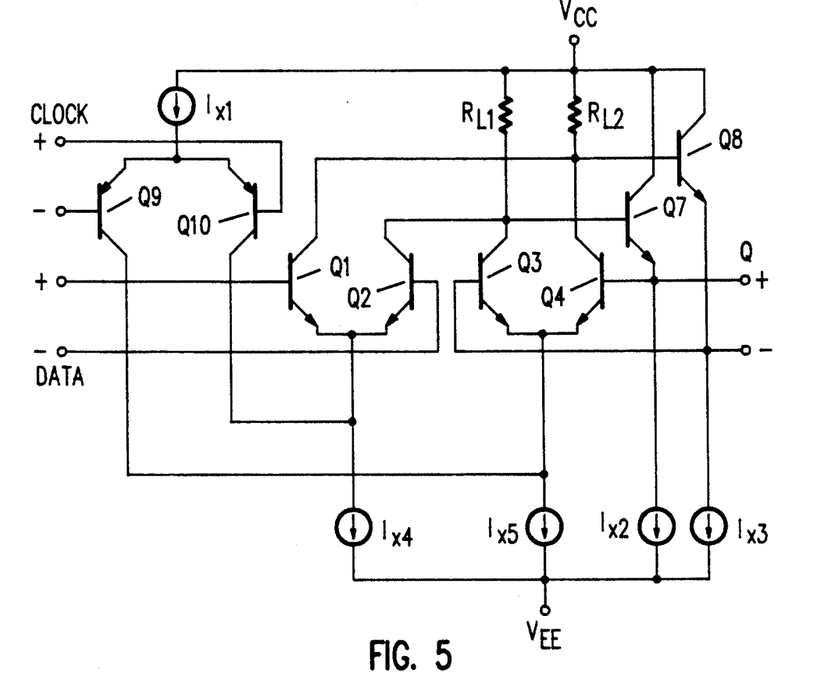
FIG. 5 is a schematic diagram of a further embodiment of the present invention in the form of a logic cell.

Referring to FIG. 5, a further modified logic cell is disclosed which primarily utilizes NPN transistors. The cell includes an input differential pair which includes transistors $Q_1$ and $Q_2$ having their emitters coupled to a common current source $I_{X4}$. The output of the input differential pair is coupled to an output differential pair which includes transistors $Q_3$ and $Q_4$ by way of emitter-follower configured transistors $Q_7$ and $Q_8$. The input differential pair and the output differential pair share common load resistors $R_{L1}$ and $R_{L2}$.

The output differential pair transistors $Q_3$ and $Q_4$ have their emitters coupled to a common current source $I_{X5}$. In addition, emitter follower transistors $Q_7$ and $Q_8$ are coupled to separate current sources $I_{X2}$ and $I_{X3}$. Again, the output of the cell is at the emitters of transistors $Q_7$ and $Q_8$.

The FIG. 5 cell includes a switching circuit which is responsive to the clock signal and which includes a pair of PNP transistors $Q_9$ and $Q_{10}$ having their emitters coupled to a common current source $I_{X1}$. Current source $I_{X1}$ has an output magnitude which matches that of both sources $I_{X4}$ and $I_{X5}$. The collector of transistor $Q_9$ is connected to current source $I_{X5}$ and the collector of transistor $Q_{10}$ is connected to current source $I_{X4}$.

In operation, during one phase of the input clock, transistor $Q_9$ is on and transistor $Q_{10}$ is off. That means that all of the current from source $I_{X1}$ flows through transistor $Q_9$ into source $I_{X5}$. Since the magnitude of the two current sources are the same, all of the current required by source $I_{X5}$ is provided by source $I_{X1}$. There is no remaining current available for the output stage differential pair made up of transistors $Q_3$ and $Q_4$ so the output stage is inactive.

At the same time, transistor $Q_{10}$ is off so that all of the current required by source $I_{X4}$ is provided by transistors $Q_1$ and $Q_2$. Thus, the input differential pair is active and the data input appears at the output of the circuit.

When the clock changes phase, transistor $Q_{10}$ is turned on and $Q_9$ is turned off. The input differential stage then becomes inactive since all current for source $I_{X4}$ is provided by transistors $Q_{10}$ and the output stage is active since all current required by the stage is provided by transistors $Q_3$ and $Q_4$. Thus, the data from the input stage is transferred to the output stage and to the output. Any further changes in the input data will not affect the cell since the input stage is inactive.

The voltage required for reliable operation of the FIG. 5 cell is less than that of the conventional cell of FIG. 2. The portion of the cell which requires the largest operating voltage is that which includes the output differential pair and therefore determines the minimum operating voltage. The minimum operating voltage, which is determined by inspection, is as follows:

$$V_{MIN} = V_{ZL} + V_{BE(Q7/8)} + V_{BE(Q3/4)} + V_{IX5} \quad (4)$$

where $V_{MIN}$ is the minimum operating voltage for the modified cell;

$V_{ZL}$ is the minimum quiescent voltage across the load resistors $R_{L1}/R_2$;

$V_{BE(Q7/8)}$ is the minimum quiescent base-emitter voltage of transistors $Q_7/Q_8$;

$V_{BE(Q3/4)}$ is the minimum quiescent base-emitter voltage for transistors $Q_{3/4}$; and $V_{IX5}$ is the minimum quiescent current source voltage.

Assuming that the minimum voltage for $V_{BE(Q7/8)}$ $V_{BE(Q3/4)}$ and $V_{IX5}$ is 0.75 volts and the minimum voltage for $V_{ZL}$ is 0.25 volts, the minimum operating voltage is 2.5 volts, a substantial improvement over the conventional cell of FIG. 2 which, as previously noted, requires 3.25 volts.

Figure 6:
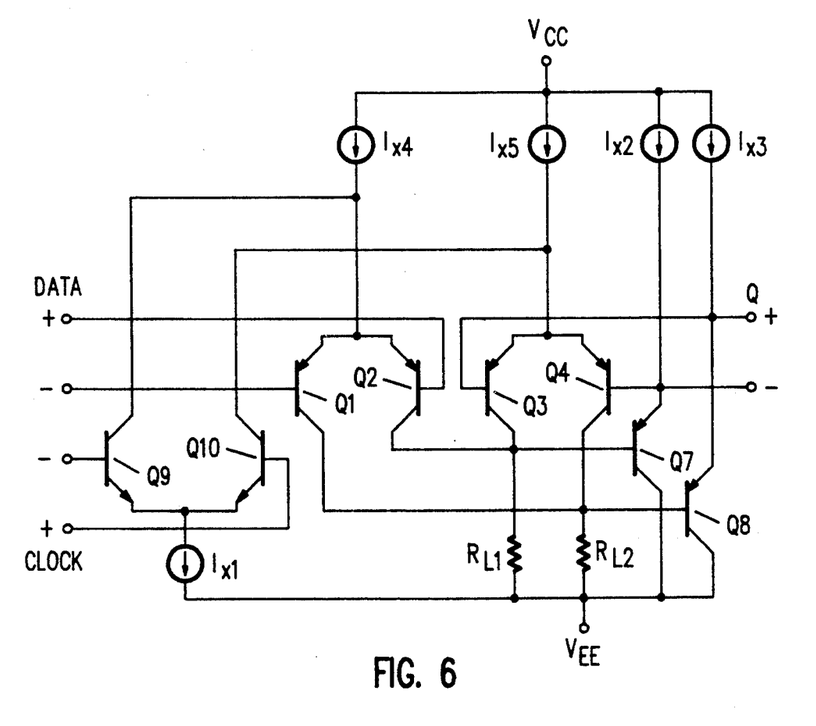
FIG. 6 is a schematic diagram of another embodiment of the present invention which is the complement of the circuit of FIG. 5.

FIG. 6 is a modified cell which is the complement of the FIG. 5 cell. The NPN transistors are replaced with PNP transistors and the PNP transistors are replaced with NPN transistors. In addition, the polarity of the supply voltage is reversed. The improvement in minimum operating voltage over the conventional FIG. 2 circuit is the same as the FIG. 5 circuit.

As previously noted, FIG. 7 is a conventional cell which does not include the emitter-follower configured output transistors $Q_7$ and $Q_8$ of the conventional FIG. 2 circuit. Instead, the output of the input differential stage is connected directly to the input of the output differential stage and directly to the output of the cell. Although the drive capability of the FIG. 7 cell is somewhat less than that of the FIG. 2 and the speed is reduced, the operating voltage is lowered. As can be seen from inspection, the minimum operating voltage is as follows:

$$V_{MIN} = V_{CE(Q5/6)} + V_{BE(Q1/2/3/4)} + V_{ZL} + V_{IX1} \quad (5)$$

where, $V_{MIN}$ is the minimum supply voltage;

$V_{CE(Q5/6)}$ is the minimum quiescent collector-emitter voltage;

$V_{BE(Q1/2/3/4)}$ is the minimum quiescent base-emitter voltage;

$V_{ZL}$ is the minimum quiescent load voltage; and $V_{IX}$ is the minimum quiescent current source voltage.

Assuming that the minimum voltage for $V_{CE}$, $V_{BE}$ and $V_{IX}$ is 0.75 volts and is 0.25 volts for $V_{ZL}$, the minimum operating voltage $V_{MIN}$ is 2.75 volts. That is substantially less than the 3.25 volts required by the conventional cell of FIG. 2 but still further reduced operating voltages are desirable.

Figure 8:
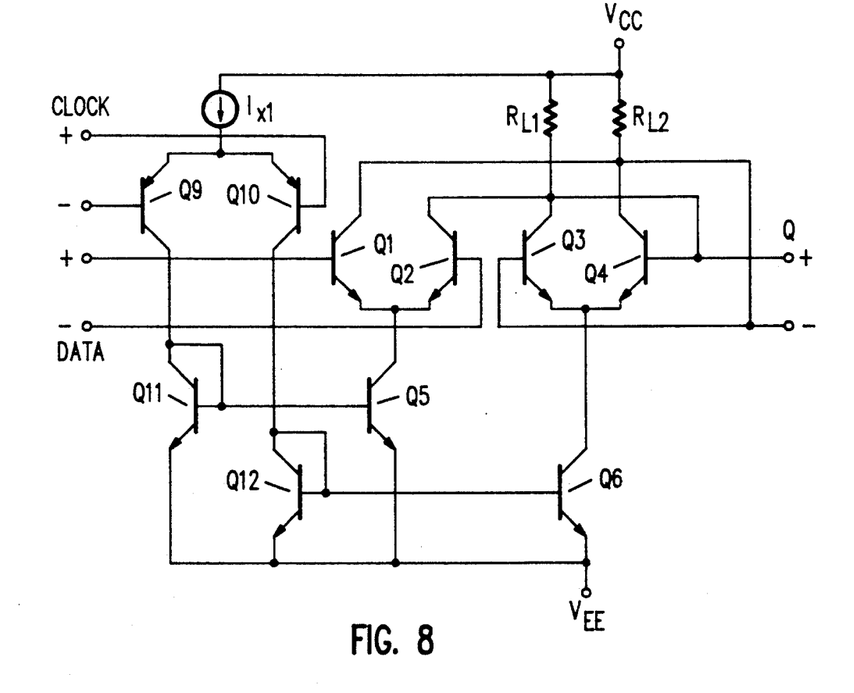
FIG. 8 is a schematic diagram of a another embodiment of the present invention in the form of a logic cell.

FIG. 8 is a still further modified cell which does not include the emitter-follower configured output transistors $Q_7$ and $Q_8$ of the improved cell of FIG. 3. Instead, the output of the input differential stage is connected directly to the input of the output differential stage and directly to the output of the cell. Although the drive capability of the FIG. 8 cell is somewhat less than that of the FIG. 4 cell and the speed is reduced, the operating voltage is further lowered. As can be seen from inspection, the minimum operating voltage is as follows:

$$V_{MIN} = V_{IX}V_{CE(Q9/10)} + V_{BE(Q11/12)} \quad (6)$$

where $V_{MIN}$ is the minimum operating voltage for the modified cell;

$V_{IX}$ is the minimum quiescent voltage across the current sources; and $V_{CE(Q9/10)}$ is the minimum quiescent collector-emitter voltage for transistors $Q_{9/10}$; and $V_{BE(Q11/12)}$ is the minimum quiescent base-emitter voltage for transistors $Q_{11/12}$.

Assuming that the minimum voltage for $V_{BE}$, $V_{CE}$ and $V_{IX}$ is 0.75 volts, the minimum operating voltage $V_{MIN}$ is 2.25 volts. That is a further reduction of minimum required operating voltage of 2.75 volts for improved cell of FIG. 3. It should be noted that a similar reduction of minimum operating voltage can be achieved in the FIG. 4 complementary cell by removing transistors $Q_7$ and $Q_8$ connecting the output of the input differential pair directly to the output of the cell and directly to the input of the output differential pair.

Figure 9:
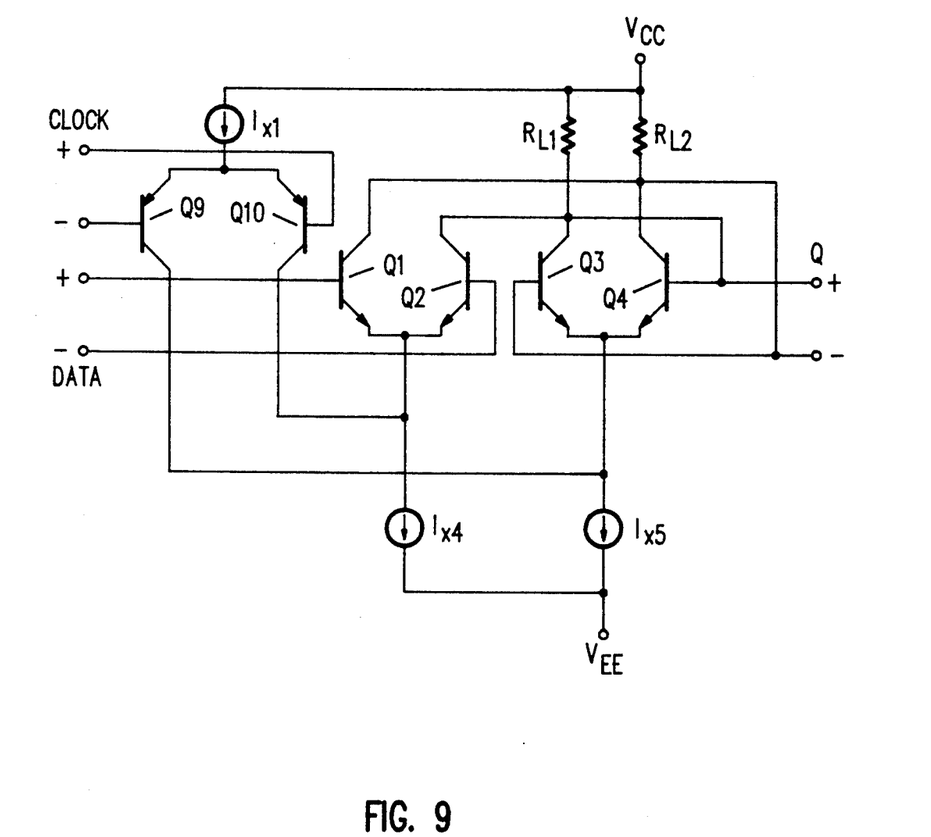
FIG. 9 is a schematic diagram of a still another embodiment of the present invention in the form of a logic cell.

FIG. 9 is a still further modified cell which does not include the emitter-follower configured output transistors $Q_7$ and $Q_8$ of the improved cell of FIG. 5. Instead, the output of the input differential stage is connected directly to the input of the output differential stage and directly to the output of the cell. Although the drive capability of the FIG. 9 cell is somewhat less than that of the FIG. 5 and the speed is reduced, the operating voltage is further lowered. As can be seen from inspection, the minimum operating voltage is as follows:

$$V_{MIN} = 2V_{IX} + V_{CE(9/10)} \quad (7)$$

where $V_{MIN}$ is the minimum operating voltage for the modified cell; and $V_{IX}$ is the minimum quiescent voltage across the current sources; and $V_{CE(Q9/10)}$ is the minimum quiescent collector-emitter voltage for transistors $Q_{9/10}$.

Assuming that $V_{IX}$ and $V_{CE(Q9/10)}$ are each 0.75 volts, the minimum operating voltage for the FIG. 9 cell is 2.25 volts. That represents a significant further improvement over the minimum operating voltage of the FIG. 5 cell of 2.5 Volts. A similar improvement in minimum operating voltage can be achieved for the complementary circuit of FIG. 6 by deleting transistors $Q_7$ and $Q_8$ and connecting the output of the input differential pair directly to the output of the cell and the input of the output differential pair.

Figure 10:
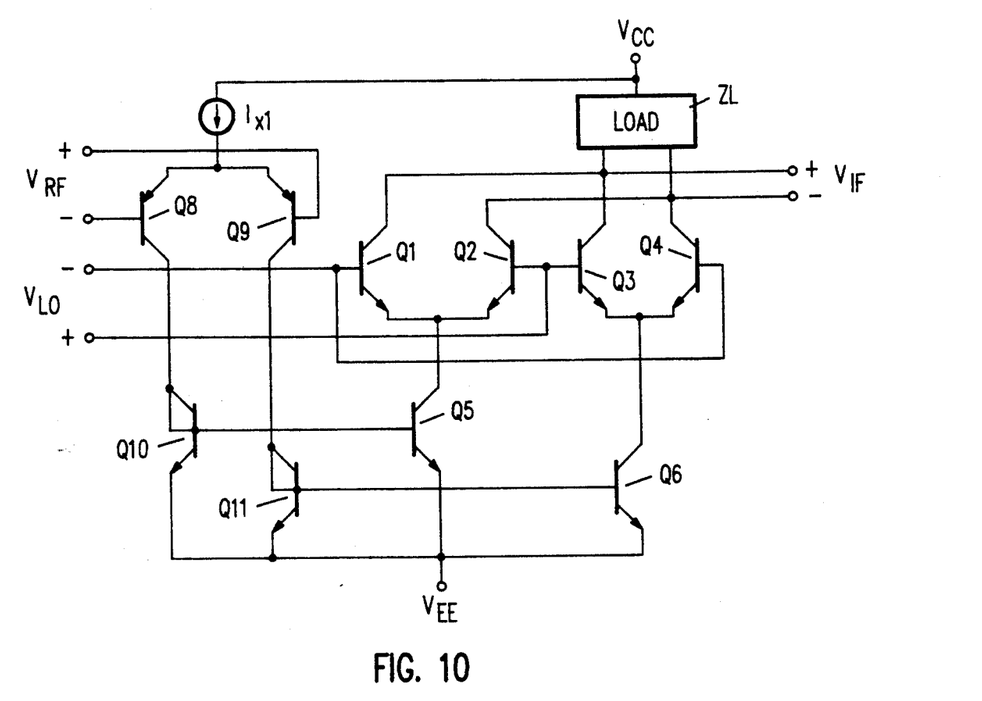
FIG. 10 is a schematic diagram of another embodiment of the subject invention in the form of a multiplier circuit used as a frequency converter.

The minimum operating voltage of the FIG. 1 multiplier can also be improved. Referring to FIG. 10, a modified multiplier circuit is depicted. Again, the multiplier is configured as a mixer or frequency converter where the output of a local oscillator $V_{LO}$ is combined with a radio frequency signal $V_{RF}$ to produce an intermediate frequency signal $V_{IF}$.

The FIG. 10 converter includes a first differential pair of NPN transistors $Q_1$ and $Q_2$ and a second differential pair of NPN transistors $Q_3$ and $Q_4$ which drive a common load $Z_L$. The base electrodes of transistors $Q_2$ and $Q_3$ form the positive input for the differential input signal $V_{LO}$ and the base electrodes transistors $Q_1$ and $Q_4$ form the negative input.

The inputs for the radio frequency signal $V_{RF}$ are the base electrodes of a pair of differentially-connected PNP transistors $Q_8$ and $Q_9$. A current source $I_{X1}$ is coupled to the common emitter connection of transistors $Q_8$ and $Q_9$. The collectors of transistors $Q_8$ and $Q_9$ are connected to the base/collector terminals of NPN transistors $Q_{10}$ and $Q_{11}$, respectively. Transistors $Q_{10}$ and $Q_{11}$ are both connected as diodes.

The FIG. 10 circuit further includes an NPN transistor $Q_5$ having a collector connected to the common emitter junction of transistors $Q_1$ and $Q_2$ and a second NPN transistor $Q_6$ having a collector which is connected to the common emitter junction of transistors $Q_3$ and $Q_4$. The emitters of transistors $Q_5$, $Q_6$, $Q_{10}$ and $Q_{11}$ are connected to the negative supply Vee. Transistors $Q_{10}$ and $Q_5$ function together as a current mirror as do transistors $Q_{11}$ and $Q_6$. Accordingly, as signal $V_{RF}$ varies the current in transistors $Q_{10}$ and $Q_{11}$, the current is caused to vary in transistors $Q_{10}$ and $Q_{11}$. Due to the action of the current mirrors, current also changes in transistors $Q_5$ and $Q_6$. This causes changes in the transconductance of the two differential pairs so that the gain of the two pair change in the same manner as the conventional converter of FIG. 1.

The minimum operating voltage of the FIG. 10 circuit can be determined by inspection and is as follows:

$$V_{MIN} = V_{ZL} + V_{CE(Q1/2/3/4)} + V_{CE(Q5/6)} \quad (7)$$

where, $V_{MIN}$ is the minimum operating voltage;
$V_{ZL}$ is the minimum quiescent load voltage; and
$V_{CE}$ is the minimum quiescent collector-emitter voltage.

Assuming that $V_{ZL}$ is 1 volt and $V_{CE}$ is 0.75 volts, the minimum operating voltage $V_{MIN}$ is 2.50 volts. The minimum operating voltage of the conventional FIG. 1 circuit is 3.25 volts.

Figure 11:
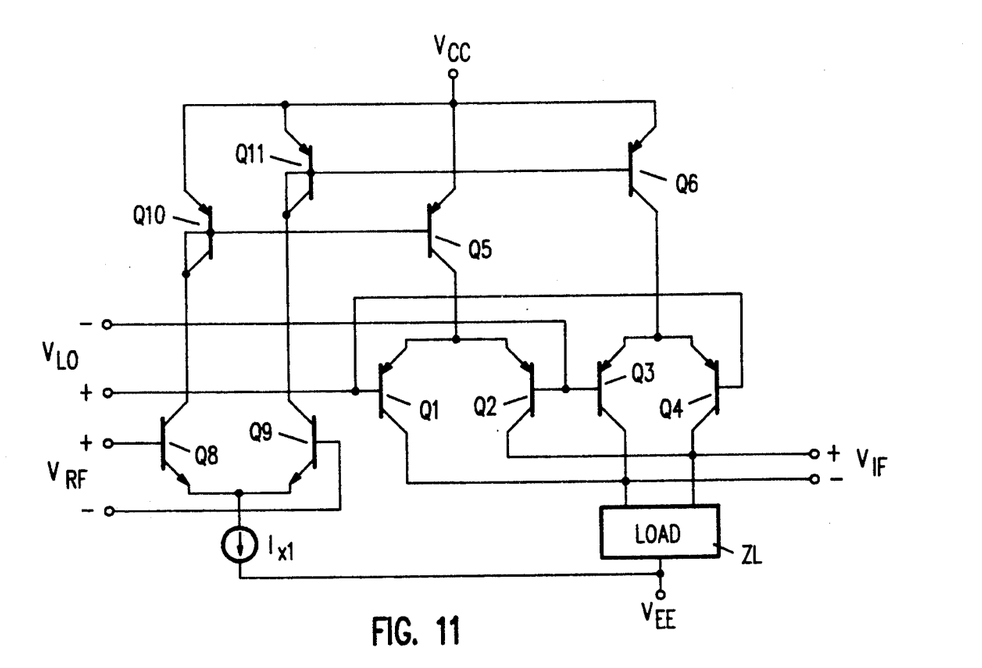
FIG. 11 is a schematic diagram of the complement of the FIG. 10 embodiment of the present invention.

FIG. 11 is the complement of FIG. 10, with the NPN transistors of FIG. 10 being replaced by PNP transistors, the PNP transistors of FIG. 10 being replaced by NPN transistors. In addition, the polarity of the supplies is reversed. The improvement in minimum operating voltage over the conventional circuit of FIG. 1 is the same as the circuit of FIG. 10.

Figure 12:
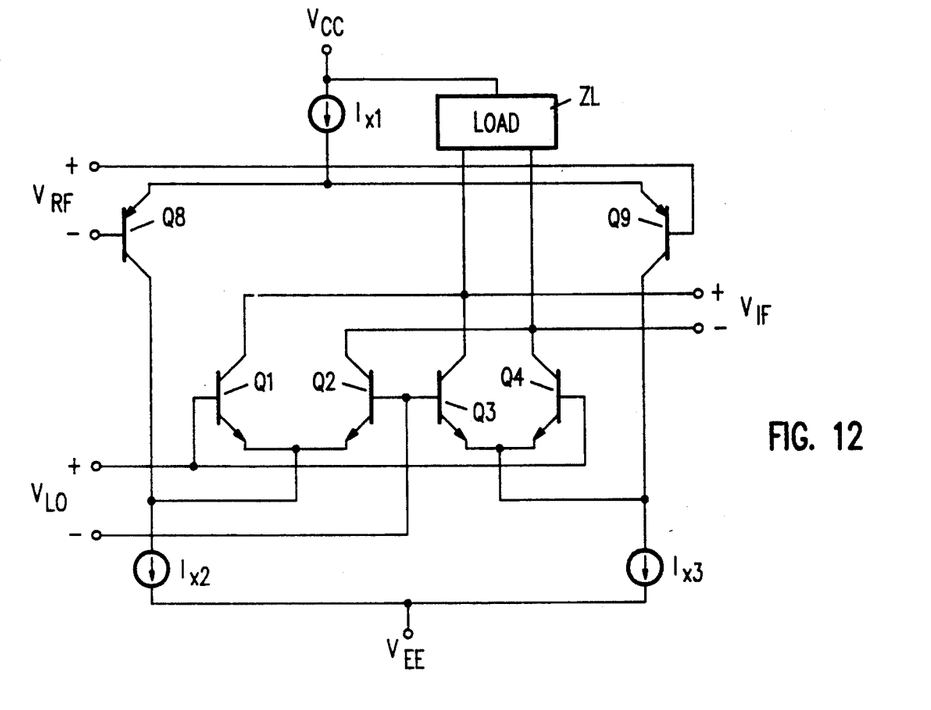
FIG. 12 is a schematic diagram of still another embodiment of the present invention in the form of a multiplier circuit used as a frequency converter.

FIG. 12 is a still further modified converter. The converter circuit includes two differential pairs having a common load $Z_L$. The first differential pair includes NPN transistors $Q_1$ and $Q_2$ and the second pair includes NPN transistors $Q_3$ and $Q_4$. The positive $V_{LO}$ signal is connected to the bases of transistors $Q_1$ and $Q_4$ and the negative V signal is connected to the bases of transistors $Q_2$ and $Q_3$.

The $Q_1/Q_2$ differential pair has a current source $I_{X2}$ connected to the common emitter junction. The $Q_3/Q_4$ differential pair has a current source $I_{X3}$ connected to the common emitter junction of transistors $Q_3$ and $Q_4$.

The $V_{RF}$ signal is coupled to the base electrodes of a differential pair of PNP transistors $Q_8$ and $Q_9$. The common emitter connection of transistors $Q_8$ s and $Q_9$ is coupled to a current source $I_{X1}$ having a magnitude set equal to that of sources $I_{X2}$ and $I_{X3}$. The collectors of transistors $Q_8$ and $Q_9$ are connected to the output of current sources $I_{X2}$ and $I_{X3}$, respectively.

In operation, signal $V_{RF}$ causes transistors $Q_8$ and $Q_9$ to conduct varying amounts of current provided by source $I_{X1}$. This causes the current available to the input and output differential pair to vary in accordance with signal $V_{RF}$. Since the current required by sources $I_{X2}$ and $I_{X3}$ is fixed, any current provided to either current source by transistors $Q_8$ and $Q_9$ will be subtracted from that available to the associated input or output differential pair. For example, if signal $V_{RF}$ causes transistor $Q_8$ to conduct more current and $Q_9$ to conduct less current, the current provided to the $Q_1/Q_2$ differential pair will decrease and that provided to the $Q_3/Q_4$ pair will increase. This action causes the transconductance of the differential pair to change so that the circuit will function as a multiplier circuit.

The minimum operating voltage for the circuit of FIG. 12 can be determined by inspection and is as follows:

$$V_{MIN} = V_{ZL} + V_{CE(Q1/2/3/4)} + V_{IX} \quad (8)$$

where, $V_{MIN}$ is the minimum operating voltage;
$V_{ZL}$ is the minimum quiescent load voltage;
$V_{CE}$ is the collector-emitter voltage; and
$V_{IX}$ is the minimum quiescent voltage across the current sources.

Assuming that $V_{ZL}$ is 1 volt and $V_{CE}$ and $V_{IX}$ are 0.75 volts, $V_{MIN}$ is 2.5 volts. As previously noted in connection with the conventional multiplier of FIG. 1, the minimum operating voltage of that circuit is 3.25 volts.

Figure 13:
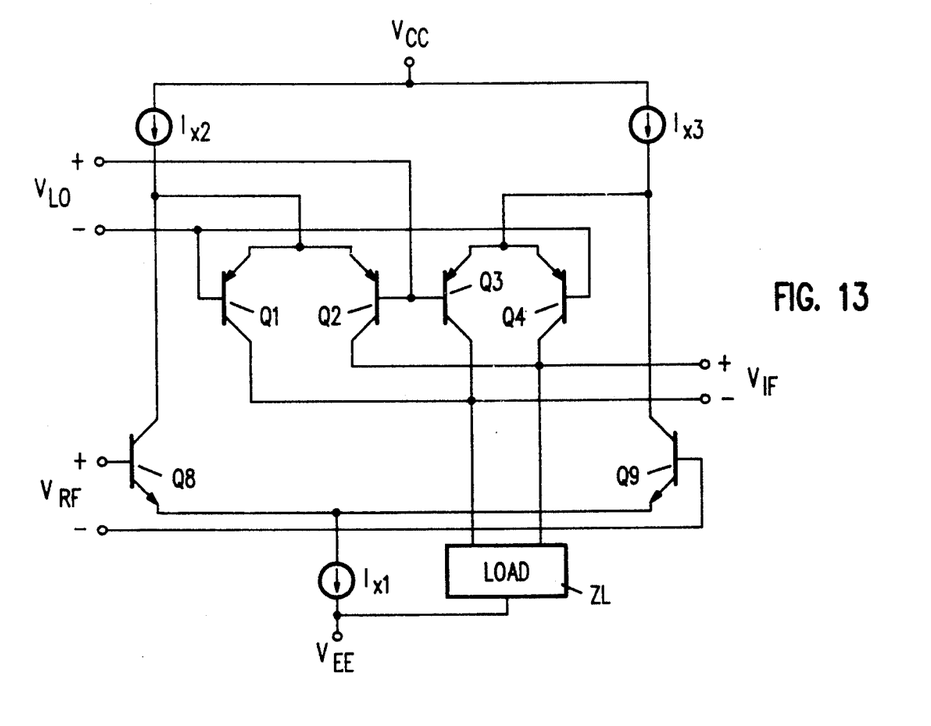
FIG. 13 is a schematic diagram of the complement of the FIG. 12 embodiment of the present invention.

FIG. 13 is the complement of the FIG. 12 circuit. The PNP transistors are replaced with NPN transistors and the NPN transistors are replaced with voltages are reversed. The operation of the FIG. 13 circuit is the same as that of the FIG. 12 circuit and the improvement in minimum operating voltage is the same.

Thus, various embodiments of circuit employing differential transistor pairs having low voltage operating capabilities have been disclosed. Although these embodiments have been described in some detail, it is to be understood that changes can be made without departing from the spirit and scope of the invention as defined by the appended claims. By way of example, the input signals have been depicted and described as differential signals, but such signals could also be single-ended signals. In that event, one of the inputs to a differential pair will receive the single-ended signal and the remaining input will be held at A.C. ground.

I claim:

1. A circuit suitable for relatively low voltage operation for processing first and second input signals so as to produce an output signal, said circuit including:
   first and second power supply busses;
   first control stage means for receiving the first input signal and for producing the output signal, said first control stage means including
   (1) a first differential stage which includes a first and second transistors each having first, second and third control electrodes, with the first electrodes coupled together and the second electrode of at least the first transistor for receiving the first input signal;
   (2) a second differential stage which includes third and fourth transistors each having first, second and third control electrodes, with the first electrodes coupled together;
   (3) load means for providing a load for at least the second differential stage which is coupled between the second differential stage and the first bus, with the output signal appearing at the junction between the second differential pair and the load means;
   second control stage means for controlling current flow through the first and second differential stages in response to the second input signal, said control means including
   (1) a third differential stage which includes fifth and sixth transistors, each having first, second and third control electrodes, the first electrodes coupled together and at least the second electrode of the fifth transistor for receiving the second input signal and a first current source coupled between the first electrodes of the fifth and sixth transistors and the first power supply bus; and
   (2) current control means for controlling current flow in said first and second differential stage in response to current flow in said third differential stage, said current control means being coupled between said second bus and said first electrodes of said first, second, third and fourth transistors.

2. The circuit of claim 1 wherein said current control means includes a second current source coupled to the first electrodes of said first and second transistors and the third electrode of said fifth transistor and a third current source coupled to the first electrodes of said third and fourth transistors and the third electrode of said sixth transistor.

3. The circuit of claim 2 wherein the second input signal is a differential signal with one polarity coupled to the second electrode of said fifth transistor and with an opposite polarity coupled to the second electrode of said sixth transistor.

4. The circuit of claim 3 wherein the first input signal is a differential signal with one polarity coupled to the second electrodes of said first and fourth transistors and an opposite polarity coupled to the second electrodes of said second and third transistors.

5. The circuit of claim 4 wherein the transistors are bipolar transistors and the first, second and third electrodes are the emitter, base and collector electrodes, respectively.

6. The circuit of claim 5 wherein said first, second, third and fourth transistors are NPN type transistors and said fifth and sixth transistors are PNP type transistors and the polarity of the first bus is positive with respect to the second bus.

7. The circuit of claim 5 wherein said first, transistors and said fifth and sixth transistor are NPN type transistors and the polarity of the second bus is positive with respect to the first bus.

8. The circuit of claim 3 wherein the first input signal is a differential signal having one polarity coupled to the second electrodes of the first transistor and an opposite polarity coupled to the second electrode of the first transistor.

9. The circuit of claim 8 wherein the first through sixth transistors are bipolar transistors and the first, second and third electrodes are the emitter, base and collector electrodes, respectively.

10. The circuit of claim 9 wherein said first, second, third and fourth transistors are NPN type transistors and said fifth and sixth transistors are PNP type transistors and the polarity of the first bus is positive with respect to the second bus.

11. The circuit of claim 9 wherein said first, second, third and fourth transistors are PNP type transistors and said fifth and sixth transistors are NPN type transistors and the polarity of the second bus is positive with respect to the first bus.

12. The circuit of claim 1 wherein the current control means includes a seventh transistor having a third electrode coupled to the first electrodes of the first and second transistors and a first electrode coupled to the second power bus and an eighth transistor having a third electrode coupled to the first electrodes of the third and fourth transistors and a first electrode coupled to the second power bus.

13. The circuit of claim 12 wherein the current control means includes a ninth transistor having second and third electrodes coupled to the third electrode of the fifth transistor and to the second electrode of the seventh transistor and a first electrode coupled to the second power bus and a tenth transistor having second and third electrodes coupled to the third electrode of the sixth transistor and to the second electrode of the eighth transistor and a first electrode coupled to the second power bus.

14. The circuit of claim 13 wherein the first input signal is a differential signal having one polarity coupled to the second electrode of the first transistor and an opposite polarity coupled to the second electrode of the second transistor and wherein the second input signal is a differential signal having one polarity coupled to the second electrode of the fifth transistor and an opposite polarity coupled to the second electrode of the sixth transistor.

15. The circuit of claim 14 the output signal is a differential signal having one polarity produced at the third electrode of the third transistor and an opposite polarity produced at the third electrode of the fourth transistor.

16. The circuit of claim 15 wherein the first through tenth transistors are bipolar transistors and the first, second and third electrodes are the emitter, base and collector electrodes, respectively.

17. The circuit of claim 16 wherein the first through fourth and seventh through tenth transistors are NPN transistors and the fifth and sixth transistors are PNP transistors.

18. The circuit of claim 16 wherein the first through fourth and seventh through tenth transistors are PNP transistors and the fifth and sixth transistors are NPN transistors.

19. The circuit of claim 13 wherein the first input signal is a differential signal having one polarity coupled to the second electrodes of the second and third transistors and an opposite polarity coupled to the second electrodes of the first and fourth transistors.

20. The circuit of claim 19 wherein the output signal is a bipolar signal having one polarity produced at the third electrodes of the first and third transistors and an opposite polarity produced at the third electrodes of the second and fourth transistors.

21. The circuit of claim 20 wherein the first through tenth transistors are bipolar transistors and the first, second and third electrodes are the emitter, base and collector electrodes, respectively.

22. The circuit of claim 21 where the first through fourth and seventh through tenth transistors are NPN type transistors and the fifth and sixth transistors are PNP type transistors.

23. The circuit of claim 21 where the first through fourth and seventh through tenth transistors are PNP type transistors and the fifth and sixth transistors are NPN type transistors.

24. The circuit of claim 1 wherein the circuit has a pair of outputs which are connected directly to the respective third electrodes of the third and fourth transistors.

25. A multiplier circuit for multiplying first and second signals so as to produce a product signal, said multiplier circuit comprising:

first and second power supply busses;

a first differential stage which includes first and second transistors each having first, second and third electrodes, with the first electrodes coupled together and the second electrode of at least the first transistor configured to receive the first input signal;

a second differential stage which includes third and fourth transistors each having first, second and third electrodes, with the first electrodes coupled together and the second electrode of at least the fourth transistor configured to receive the first input signal;

a load coupled between the first and second differential stages and the first bus;

a third differential stage which includes fifth and sixth transistors each having first, second and third electrodes, with the first electrodes coupled together and the second electrode of the fifth transistor configured to receive the second input signal;

a current source coupled between the first electrodes of the fifth and sixth transistors and the first bus;

current control means for controlling current flow in said first and second differential stages in response to current flow changes in the third differential stage caused by changes in the second input signal;

whereby the product signal is produced between the load and the first and second differential stages.

26. The multiplier circuit of claim 25 wherein the second electrodes of said second and third transistors are coupled together.

27. The multiplier circuit of claim 26 wherein said first signal is a differential signal with one polarity coupled to the second electrodes of the first and fourth transistors and an opposite polarity coupled to the second electrodes of the second and third transistors.

28. The multiplier circuit of claim 27 wherein the second signal is a differential signal with one polarity coupled to the second electrode of the fifth transistor and an opposite polarity coupled to the second electrode of the sixth transistor.

29. A logic cell for storing data input signal upon receipt of a multiple phase clock signal, said cell comprising:

first and second power supply busses;

a first differential stage which includes first and second transistors each having first, second and third electrodes, with the first electrodes coupled together and the second electrode of the first transistor configured to receive the data signal;

a second differential stage which includes third and fourth transistors each having first, second and third electrodes, with the first electrodes coupled together and the second electrodes coupled to the third electrodes of the first and second transistors, respectively;

a load coupled between the second differential stage and the first bus;

a third differential stage which includes fifth and sixth transistors each having first, second and third electrodes, with the first electrodes coupled together and the second electrode of the fifth transistor configured to receive the clock signal;

a current source coupled between the first electrodes of the fifth and sixth transistors and the first bus;

current control means for controlling current flow in said first and second differential stages in response to current flow changes in the third differential stage caused by changes in the clock signal;

whereby data corresponding to the data input signal is transferred to the first differential stage during one phase of the clock signal and is transferred from the first stage to the second stage during another phase of the clock signal.

30. The logic cell of claim 29 wherein the clock signal is a differential signal with one polarity being coupled to the second electrode of the fifth transistor and with an opposite polarity being coupled to the second electrode of the sixth transistor.

31. The logic cell of claim 29 wherein the data signal is a differential signal with one polarity coupled to the second electrode of the first transistor and with the opposite polarity being coupled to the second electrode of the second transistor.

* * * * *

UNITED STATES PATENT AND TRADEMARK OFFICE
CERTIFICATE OF CORRECTION

PATENT NO. : 5,196,742

DATED : March 23, 1993

INVENTOR(S) : Mark Douglas McDonald

It is certified that error appears in the above - identified patent and that said Letters Patent is hereby corrected as shown below:

In Col. 11, Claim 7, line 23, after the word "first," the following words need to be added: --second, third and fourth transistors are PNP type--

Signed and Sealed this

Fifth Day of April, 1994

Attest:

BRUCE LEHMAN

Attesting Officer

Commissioner of Patents and Trademarks